May 21, 1968 W. SHOCKLEY ET AL 3,384,768

PIEZOELECTRIC RESONATOR

Original Filed Nov. 8, 1966 2 Sheets-Sheet 1

INVENTORS
WILLIAM SHOCKLEY
DANIEL R. CURRAN

BY James A. Smith

ATTORNEY

INVENTORS
WILLIAM SHOCKLEY
DANIEL R. CURRAN
BY
ATTORNEY

United States Patent Office 3,384,768
Patented May 21, 1968

3,384,768
PIEZOELECTRIC RESONATOR

William Shockley, Los Altos, Calif., and Daniel R. Curran, Cleveland, Ohio, assignors to Clevite Corporation, a corporation of Ohio Continuation of application Ser. No. 592,947, Nov. 8, 1966. This application Sept. 29, 1967, Ser. No. 672,422
15 Claims. (Cl. 310—9.5)

ABSTRACT OF THE DISCLOSURE

This application discloses a resonator structure comprising a thin plate having electrodes on opposite major surfaces which coact with intervening piezoelectric material. The electroded region of the resonator is mass loaded whereby the electroded region of the resonator has a resonant frequency $f_a$ related to the frequency of the non-electroded region $f_b$ so that the ratio $f_a/f_b$ is from 0.8 to .999. A vibratory mode originating in the electroded region is attenuated in the surrounding non-electroded region. Reference is made to the claims for a legal definition of the invention.

The following application is a continuation of application Serial No. 592,947, filed November 8, 1966, and now abandoned, which was a continuation of application Serial No. 281,488, filed May 20, 1963 and subsequently abandoned.

This invention relates to piezoelectric resonators and, specifically, to improved resonators for use in electric filter circuits.

The invention has utility in connection with piezoelectric resonators comprising a thin wafer of monocrystalline or ceramic material having a vibrational mode producing a particle displacement in the plane of the wafer which is antisymmetrical about the center plane of the wafer. Such vibrational modes include the thickness shear, thickness twist and torsional modes all of which can be obtained with piezoelectric monocrystalline materials and in piezoelectric ceramic materials.

The typical wafer type of resonator is provided with electrodes of predetermined area on opposite planar surfaces thereof to enable the resonator to be excited electromechanically in its principal vibratory mode. At the resonance condition maximum particle motion and wave propagation occurs.

It is known with respect to prior art resonators that at the resonant condition wave propagation will occur from the electroded wafer region into the surrounding unelectroded region. The extent of such wave propagation may be referred to as the "range of action" in the unelectroded region of the wafer. In the case of a multiple resonator structure such as disclosed in application Serial No. 216,846, filed on August 14, 1962 by Daniel R. Curran and Adolph Berohn and assigned to the same assignee as the present invention, now Patent No. 3,222,622, the range of action is determinative of electrode spacing on a single wafer.

The present invention is directed to an improved resonator structure which through utilization of unique structural and frequency consideration substantially reduces wave propagation beyond the electroded region of a piezoelectric resonator wafer. Advantageously it has been found that by preventing wave propagation into the unelectroded region of the wafer a high mechanical Q is achieved coupled with improved spurious response suppression characteristics. Accordingly, it is a principal object of the present invention to provide an improved wafer type of piezoelectric resonator possessing a mechanical Q and spurious response characteristics substantially superior with respect to prior art resonators.

Another object of the invention is to provide a wafer type of piezoelectric resonator in which wave propagation beyond the electroded region of the wafer is substantially reduced.

Another object of the invention is to reduce the "range of action" of a piezoelectric resonator and thereby achieve improved sub-miniaturization of a wafer type multiple resonator structure.

The invention in general contemplates a resonator structure comprising a thin plate of piezoelectric material having electrodes on opposite major surfaces which coact with the intervening piezoelectric material to form a piezoelectric resonator. The structure of the resonator is such that the region of the piezoelectric material between the two electrodes possesses a resonant frequency lower by a predetermined amount than the resonant frequency of the outer region of material surrounding the two electrodes. With this arrangement the resonant frequency of the surrounding region of material acts as a cut-off frequency for wave propagation of the vibratory mode from the electroded region. Accordingly, at the resonant frequency of the electroded region the vibratory mode is attenuated in the surrounding region and wave propagation is minimized.

Other objects and advantages will become apparent from the following description taken in connection with the accompanying drawings wherein.

Figure 1:
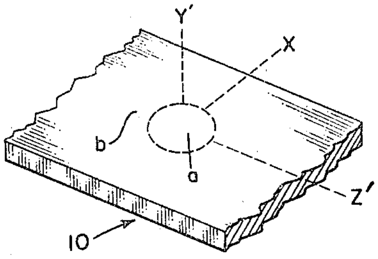
FIGURE 1 is a perspective view of a section of a piezoelectric wafer to illustrate the theoretical considerations involved in the invention.

Referring to FIGURE 1 of the drawings there is shown a schematic illustration of an unelectroded piezoelectric wafer 10 to illustrate the theoretical considerations involved in the present invention. As previously mentioned the invention is applicable to resonators of the wafer type formed from mono-crystalline or ceramic material having a vibrational mode producing a particle displacement in the plane of the wafer which is anti-symmetrical about the center plane of the wafer, e.g., thickness shear, thickness twist and torsional modes.

Known monocrystalline piezoelectric materials include quartz, Rochelle salt, DKT (di-potassium tartrate), lithium sulfate or the like. As is well known to those skilled in the crystallographic arts, the basic vibrational mode of a crystal wafer is determined by the orientation of the wafer with respect to the crystallographic axis of the crystal from which it is cut. It is known for example that a "0° Z-cut" of DKT or an "AT-cut" of quartz may be used for a thickness shear mode of vibration.

Of the various monocrystalline piezoelectrics available quartz, primarily because of its stability and high mechanical quality factor $Q_m$ is a preferred material for narrow band filter applications. An "AT-cut" quartz wafer responds in the thickness shear mode to a potential gradient between its major surfaces and is particularly suitable.

For wider band filters the wafers are preferred fabricated of a suitable polarizable ferroelectric ceramic material such as barium titanate, lead zirconate-lead titanate, or various chemical modifications thereof. Suitable ceramic material for the purposes of the invention are ceramic compositions of the type disclosed and claimed in U.S. Patent No. 3,006,857 and the copending application of Frank Kulcsar and William R. Cook, Jr., Ser. No. 164,076, filed Jan 3, 1962, now Patent No. 3,179,594, assigned to the same assignee as the present invention. Such ferroelectric ceramic compositions may be polarized by methods known to those skilled in the art. For example, a thickness shear mode of vibration may be accomplished through polarization in a direction parallel to the major surfaces of a wafer, in the manner described in U.S. Patent 2,646,610 to A. L. W. Williams.

While, as discussed, the inventive concept is equally applicable to monocrystalline or ceramic piezoelectric wafers having a vibrational mode wherein the partial motion is antisymmetrical with respect to the center plane, the disclosure will be in regard to resonators comprising an "AT-cut" quartz crystal. Accordingly, in FIGURE 1 we have shown the wafer 10 oriented with respect to the crystallographic axis X, Y' and Z' characteristic of the "AT-cut."

Figure 2:
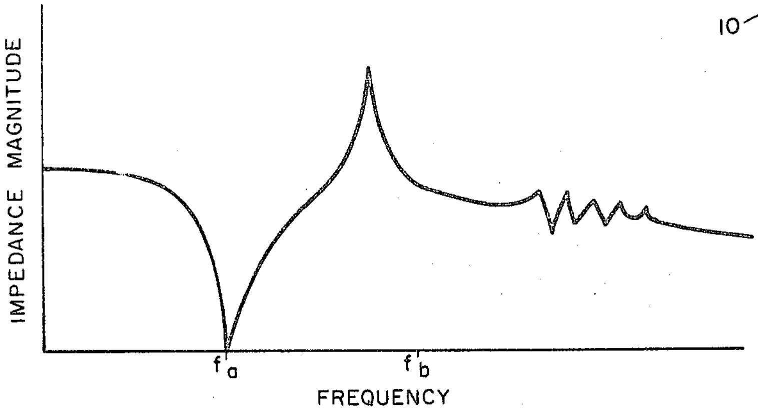
FIGURE 2 is an impedance versus frequency curve.

To illustrate the inventive concept involved in the present invention, wafer 10 is illustrated as having an inner region of circular configuration *a* surrounded by an outer region *b*. In accordance with the invention the two regions *a* and *b* are structurally different (such as in composition or physical characteristics) so that inner region *a* has a resonant frequency $f_a$ less than the resonant frequency $f_b$ of outer region *b*. To illustrate a possible resonant frequency relationship condition, there is shown in FIG- 2 a typical impedance versus frequency curve for region *a* illustrating a possible relationship of frequency $f_b$ to frequency $f_a$.

The resonant frequency relationship assumed is such that a vibratory mode in region $\alpha$ at the resonant frequency $f_a$ cannot be propagated through region *b* but rather is attenuated exponentially in region *b*. On the other hand if regions *a* and *b* were to possess approximately the resonant frequency as in prior art resonators, propagation would occur for some distance into region *b*. Thus by structurally establishing a resonant frequency difference for the two regions one region can be caused to provide a cut-off frequency for propagation of a vibrational mode originating in the other.

If opposite surfaces of region *a* are covered with suitable electrodes and excited electromechanically at frequencies near the resonant frequency $f_a$ the resultant vibratory energy will be contained with region *a* and the material of region *b* immediately adjacent thereto. Thus, a piezoelectric resonator in the form of an electroded wafer can be achieved which has a minimum range of action in the wafer material surrounding the electrodes.

It has been found that the confinement of the basic vibratory mode and vibratory energy thereof to the material region between the electrodes results in a high quality factor Q as compared to corresponding resonators having a substantially uniform resonant frequency throughout the piezoelectric material employed. The lack of propagation and lack of electromechanical coupling between regions *a* and *b* also has been found to beneficially reduce or suppress spurious (unwanted) vibratory responses which would normally result from standing wave systems produced by normal wave propagation.

An understanding of the inventive concept will be facilitated by a consideration of elastic wave theory with respect to "AT-cut" quartz wafers. In the past, analysis of elastic wave theory has been in regard to wave propagation and characteristics of allowable modes of vibration. We have extended this theory with respect to the limiting and controlling of wave propagation and to provide a theoretical analysis of the operation of the present invention. A complete mathematical analysis of the wave equations appropriate to "AT-cut" wafers possess too high a degree of complexity to be presented in detail. However, the following limited analysis and equations will render the theory of operation of the invention readily apparent to those skilled in the crystallographic arts.

Solutions to the wave equation which are appropriate to "AT-cut" quartz wafers with traction free major surfaces, are of the form $$U_x = B_1 e^{-i(2\pi f\tau - \xi_1 \zeta_3)}$$

where $U_x$ is the particle displacement in the X direction
$B_1$ is a constant representing the displacement amplitude
$\tau$ is time
$\xi$ is the propagation vector for the X direction
$\zeta$ is the propagation vector for the Z' direction
$X_1$ is the dimensional variable in the X direction
$X_3$ is the dimensional variable in the Z' direction
$f$ is frequency The parameters $\xi$ and $\zeta$ are propagation vectors for the X and Z' directions respectively and are equal to $2\pi f/v$ where $v$ is the appropriate phase velocity which is usually a parameter rather than a constant. When the values of $\xi$ and $\zeta$ are real numbers Equation (1) describes lossless wave propagation in the X and $Z_1$ direction; when $\xi$ or $\zeta$ is zero it describes an oscillatory vibration which is independent in both amplitude and phase of $X_1$ and $X_3$, respectively; and when $\xi$ and $\zeta$ are imaginary an oscillatory vibration is described which in phase is independent of $X_1$ or $X_3$ but in amplitude is an exponentially decreasing function of $X_1$ and $X_3$.

Equations for the dependence of the various propagation vectors $\xi$ and $\zeta$ on frequency and on the physical and dimensional constants of the wafer can be obtained by complex mathematical analysis and particularly by substituting five component displacement equations (three linear and two rotational) of the form of Equation 1 in the appropriate wave equations. The roots of the resulting equations, giving propagation vectors as functions of normalized frequency ratio $\Omega$ (equal to $f/f_b$) for the thickness shear, thickness twist and flexural modes under consideration are plotted in FIGURE 2. Here the dimensionless wave number is given by:

$$\Phi = \frac{\xi t}{\pi} \quad (2)$$

or $$\Phi = \frac{\zeta t}{\pi} \quad (3)$$

where $t$ is wafer thickness.

While there are ten possible modes of vibration in an "AT-cut" quartz wafer, only three principal modes are strongly excited in the plane of the wafer with limited electrode areas. These principal modes comprise the characteristic thickness shear mode and a flexural mode both of which propagate in the X direction, and a thickness twist mode which propagates in the Z' direction. Of those, both the thickness shear and thickness twist modes within region *a* of the wafer 10 illustrated in FIGURE 1 will have a cut-off frequency equal to the resonant frequency $f_b$ if the relationship between $f_a$ and $f_b$ is as shown in FIGURE 2. Accordingly, neither of the thickness shear and thickness twist modes will propagate to any appreciable extent from region *a* into region *b* of the wafer 10, and if region *a* is electroded, the vibrating energy will be substantially confined to the electroded region. More specifically, the thickness shear and thickness twist modes have amplitudes which decrease exponentially outward from the edge of region $a$ in the X and Z′ directions, respectively.

On the other hand the flexural mode has been found to have no cut-off frequency and will propagate in the X direction. This mode, however, is closely coupled to the thickness shear mode and in effect has a complex propagation constant, i.e., with an amplitude decreasing exponentially with distance in the X direction. Accordingly, the flexural mode will also be attenuated in region $b$ similar to the thickness shear and thickness twist modes in the X and Z′ directions, respectively.

Wave propagation in any arbitrary direction in the XZ′ plane of wafer 10 can be resolved into X and Z′ components and will be similarly attenuated within region $b$. Therefore in an ideal lossless wafer 10 having regions $a$ and $b$ with resonant frequencies $f_a$ and $f_b$, respectively, if the region $a$ is driven in the thickness shear mode at its resonant frequency $f_a$, the resulting vibrating energy will not propagate into region $b$ to any appreciable extent but rather will be stored in and around region $a$ of the wafer 10.

Figures 3, 4:
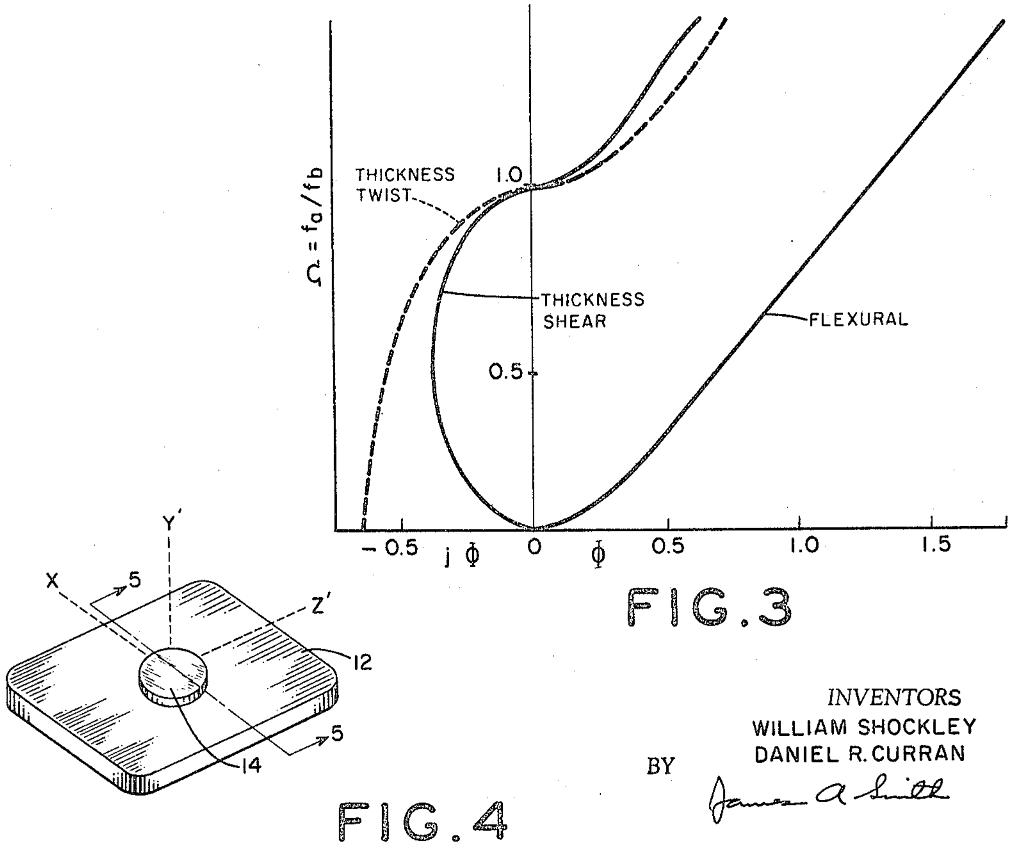
FIGURE 3 is a set of curves for determining propagation constants.
FIGURE 4 is a perspective view of a piezoelectric resonator including the invention.
Figure 5:
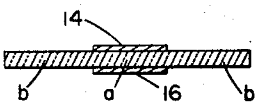
FIGURE 5 is a section taken along the line 5—5 of FIGURE 4.

Referring to FIGURES 4 and 5 of the drawings there is shown a typical high frequency quartz-resonator comprising an "AT-cut" quartz wafer 12 having electrodes 14 and 16 on opposite planar surfaces thereof. The electrodes 14 and 16 may be formed such as by evaporating on the surface of wafer 12 silver, aluminum or gold material or may be formed by chemical deposition of silver, copper or nickel. The wafer 12 is oriented with respect to the crystallographic X, Y′ and Z′ axis as shown in FIGURE 4. In accordance with the invention the resonator depicted in FIGURES 4 and 5 possess structural characteristics such as to produce a frequency relationship as shown in FIGURE 2 between the circular material region $a$ covered by electrodes 14 and 16 and the surrounding region $b$. In the embodiment of the invention shown in FIGURES 4 and 5 the desired frequency relationship is accomplished by utilizing a calculated electrode thickness $t_e$ relative to the thickness $t_w$ of wafer 12 so as to effect a predetermined mass loading of electroded region $a$ and establish a relative resonant frequency relationship similar to that illustrated in FIGURE 2.

For the thickness shear mode the propagation vector $\xi$ may be derived from appropriate wave equations in terms of wafer 12 thickness $t_w$.

$$\xi=\frac{j\pi[(1-\Omega^2)c_{66}/c_{55}]^{1/2}}{t_w} \quad (4)$$

where $c_{66}/c_{55}$ is the ratio of elastic moduli for quartz and is equal to 2.37. From this equation and appropriate wave equations the equation for the spatial distribution of vibratory energy $F_3$ in the non-electroded region $b$ of wafer 12, observed in the Z′ direction with the edge of the electrodes 14 and 16 as the origin, is of the form $$E_3=E_0e^{j2\xi X_3} \quad (5)$$

$$E_3=E_0e^{-2\pi[(1-\Omega^2)/2.37]^{1/2}(X_3/t_w)} \quad (6)$$

where $X_3$ is the distance from the electrode edge in the Z′ direction $\Omega$ is equal to $f/f_b$ $t_w$ is the thickness of wafer 12

$E_0$ is the energy at the electrode edge in the Z′ direction

From the last equation the spatial distribution of stored energy may be readily determined for particular resonant frequency ratios $\Omega_0$ ($\Omega_0=f_a/f_b$) of regions $a$ and $b$ of wafer 14. As an example, for $\Omega_0=0.99$ the equation would give at resonance an attenuation for energy density of $2.5/t_w$ db and for $\Omega_0=0.999$ of $0.79/t_w$ db. It is to be noted that the attenuation coefficient as derived denotes spatial distribution of stored energy and not energy dissipation.

With respect to the energy distribution $E_1$ in the X direction the following equation is applicable:

$$E_1=E_0e^{j2\xi X_1}$$

where values of $\xi$ are determined from FIGURE 3.

It will be apparent that smaller values of $\Omega_0$ will result in concentration of a larger fraction of the total vibratory energy in and around the electroded region $a$ of wafer 12 and thus less propagation into non-electroded region $b$. An operable range of $f_a/f_b$ would be .8 to .999 and a preferred value is in the order of .98.

It will be appreciated that by selectively varying $\Omega_0$ and thus the resonant frequency relationship of regions $a$ and $b$ of wafer 12 a condition of minimum wave propagation beyond the edges of electrodes 14 and 16 can be achieved. With a wafer 12 of uniform thickness as shown in FIGURES 4 and 5 a desired resonant frequency ratio $\Omega_0$ can be achieved by varying the thickness $t_e$ and/or compositions of electrodes 14 and 16 relative to the thickness $t_w$ of wafer 12. The following equation may be derived from which relative thickness values may be determined:

$$t_e=\frac{1}{2}\frac{\rho_p}{\rho_e}\left(\frac{f_b-f_a}{f_b}\right)t_w \quad (7)$$

where $\rho_e$=density of the electrode material forming electrodes 14 and 16

$\rho_q$=density of quartz

It will thus be appreciated that the desired frequency relationship is achieved in the embodiment of FIGURES 4 and 5 by relative proportioning of the thickness dimension of the electrodes 14 and 16 and wafer 12 with reference to the relative material density. It will be particularly appreciated that the frequency relationship is independent of wafer or electrode area and, therefore, that the invention is not dependent on particular planar dimensions.

The confinement of the vibratory energy to the electroded region of the resonator wafer 12 has been found to beneficially result in mechanical Q and spurious response characteristics superior to that achieved with prior art resonators. Experimental data with respect to mechanical Q as a function of the distance from the electrode edge to the nearest edge of the wafer 12 in the X and Z′ directions is plotted in FIGURES 6 and 7, respectively. In each curve the measured mechanical Q is plotted along the ordinate while electrode to wafer edge distance in wafer thickness ($x/t_w$) is plotted along the abscissa. The curves of FIGURES 6 and 7 were obtained by progressively reducing the distance $x$ from the electrode edge to the wafer edge in the X direction (FIGURE 6) and in the Z′ direction (FIGURE 7) and measuring mechanical Q. It is to be noted that both curves exhibit a mechanical Q which increases sharply with distance $x$ and reaches maximum between $x/t_w=10$ and $x/t_w=15$.

Figure 6:
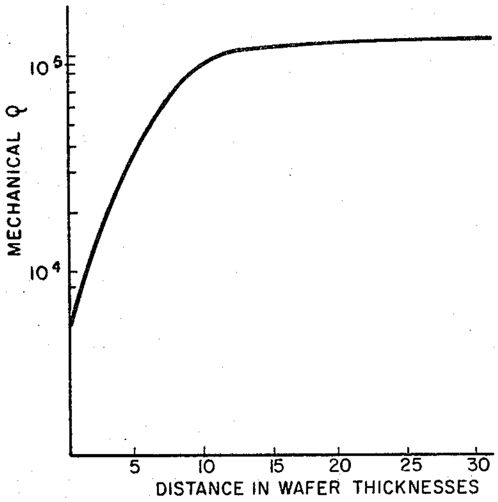
FIGURES 6 and 7 are curves illustrating mechanical Q characteristics of the resonator shown in FIGURE 4.
Figure 7:
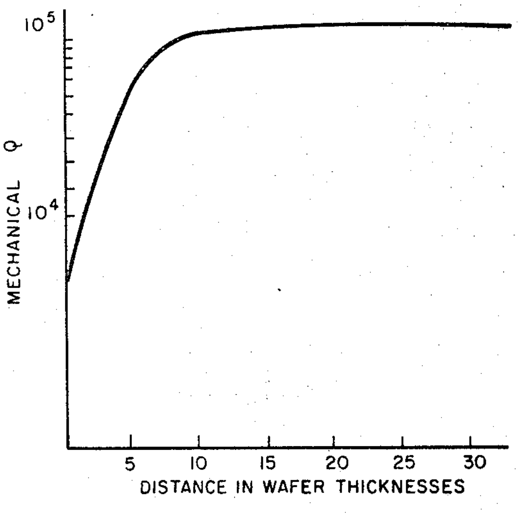

The exponential shape of the curves shown in FIGURES 6 and 7 is evidence of the exponential decrease in wave propagation of the principal vibratory modes, in the X and Z′ directions. The $x/t_w$ value at which maximum $Q_m$ is obtained corresponds to the maximum range of wave propagation and thus the maximum range of action.

With respect to FIGURE 7 the following analytical equation has been derived for mechanical Q in terms of distance $x$ in the Z′ direction:

$$Q=(\delta_1e^{-2\gamma x}+\delta_2)^{-1} \quad (8)$$

where $\delta_2$ is equal to $1/Q_m$ with respect to an infinite plate with all other factors being equal and has a value of $8.9\times10^{-6}$ $\delta_1$ is the attenuation factor associated with the wafer edge and equal to $1.3\times10^{-4}$
$\gamma$ is $-jt_w\zeta=0.29$ With respect to FIGURE 6 the following analytical equation has been derived for $Q_m$ in terms of distance $x$ in the X direction:

$$Q=(\delta_1 e^{-2\gamma x}+\delta_2)^{-1} \quad (9)$$

where $\delta_1=2.0\times10^{-4}$
$\delta_2=9.6\times10^{-6}$
$\gamma=-jt_w\xi=0.18$ Resonators such as shown in FIGURES 4 and 5 have been found to inherently provide suppression of spurious (unwanted) vibratory responses. This beneficial characteristic is believed to be the result of reduction in the electromechanical coupling between the electroded region $a$ and the surrounding region $b$ and particularly a reduction in interaction of the vibratory mode in region $a$ with possible standing wave systems in region $b$. It has been found that spurious responses are suppressed at all frequencies below the resonant frequency $f_b$ of unelectroded region $b$ and materially reduced above said frequency.

Figure 8:
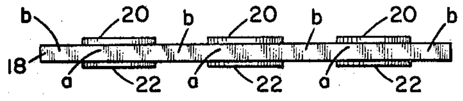
FIGURE 8 is a front view of a multi-resonator structure in accordance with the invention.

The concept disclosed herein makes possible subminiaturization of multi-resonator structures to sizes heretofore impossible. The confinement of the vibratory mode to the electroded region of the wafer and the resulting minimum "range of action" makes it possible for a plurality of electrodes to be positioned on a single wafer in closely spaced relationship without interaction between individual resonators. Referring to FIGURE 8 of the drawings there is shown such a multi-resonator structure comprising a single wafer 18 provided with spaced electrodes 20 on one major surface thereof and aligned counter electrodes 22 on the opposite major surface. The electrodes on the respective major surfaces of wafer 18 form electrode pairs which coact with the intervening piezoelectric material to form a plurality of individual piezoelectric resonators.

With respect to each individual resonator thus formed the electroded region of the wafer is provided with a resonant frequency less than the inherent resonant frequency of the non-electroded material in the manner hereinbefore described to establish a resonant frequency relationship similar to that illustrated in FIGURE 2. As a result, the vibratory energy of each individual resonator is substantially contained within the electroded region thereof, the vibratory mode being attenuated exponentially in the surrounding material. Accordingly, no appreciable wave propagation occurs and the electrodes may be positioned in closely spaced relationship. It will be apparent that the exact spacing of the electrodes may be readily determined in accordance with the exponential equations hereinbefore described.

With the embodiment of the resonators thus far described utilizing a wafer of uniform thickness the desired resonant frequency difference of regions $a$ and $b$ may be achieved by utilizing electrodes of calculated thickness and of predetermined density (gold or aluminum and other materials may be selectively employed) relative to the thickness and density of the wafer. The desired frequency difference may, however, be readily achieved by other methods some of which are more suitable for commercial use.

For example, as another embodiment of the inventive regions $a$ and $b$ can be readily formed from monocrystalline or ceramic materials having different densities and bonded together with glass. Alternately in the case of ceramic wafers glass pellets could be selectively diffused in the surface of the ceramic wafer to produce regions $a$ and $b$ differing in resonant frequency.

Figure 9:
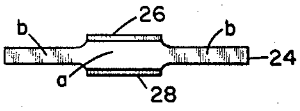
FIGURE 9 is a front view illustrating another embodiment of the resonator illustrated in FIGURES 4 and 5.

In FIGURE 9 of the drawings we have shown a preferred commercial embodiment of the invention utilizing regions $a$ and $b$ of different thickness to achieve the described resonant frequency relationship. Specifically, there is shown a piezoelectric wafer 24 of non-uniform thickness and having a circular inner region $a$ having a resonant frequency $f_a$ and a uniform thickness $t_a$ surrounded by an outer region $b$ having a resonant frequency $f_b$ and a uniform thickness $t_b$. The inner region $a$ of plate 24 is provided with aligned electrodes 26 and 28 covering the opposite face surfaces thereof which may be connected to a signal source to drive the resonator electromechanically at the resonant frequency of region $a$.

The regions $a$ and $b$ of different thickness may be achieved such as by fabricating a plate to a uniform thickness equal to thickness $t_a$ of region $a$ and then suitably masking and removing material from region $b$ by etching of the exposed wafer material. By virtue of the thickness difference the resonant frequency of the electroded region $a$ of wafer 24 has a resonant frequency less than the non-electroded region $b$. In each of the regions $a$ and $b$ of wafer 24 the resonant frequency in absence of electrodes 26 and 28 is proportional to the frequency constant N divided by the thickness and can be simply expressed as follows:

$$f_b=N/t_b \quad (10)$$

$$f_a=N/t_a \quad (11)$$

However, the thickness and density of electrodes 26 and 28 influences the resonant frequency of region $a$. The following equation in terms of the variables of electrode density $\rho_e$, quartz density $\rho_q$, and electrode thickness $t_e$ has been derived:

$$f_a=\frac{N}{t_a}\left[1-2\frac{\rho e}{\rho q}t_e\right] \quad (12)$$

Combining Equations (10) and (12) the resonant frequency ratio $\Omega_0$ may be expressed as follows:

$$\Omega_0=\frac{f_a}{f_b}=\frac{t_b}{t_a}\left[1-2\frac{\rho_e}{\rho_q}t_e\right] \quad (13)$$

It will be apparent that through use of Equations (10), (12) and (13) the regions $a$ and $b$ and electrodes 26 and 28 may be selectively sized to produce a desired resonant frequency difference between regions $a$ and $b$.

The exponential equations for energy distribution and wave propagation hereinbefore described are equally applicable to the commercial form of the invention shown in FIGURE 9. Accordingly, the "range of action" of the FIGURE 9 embodiment can be determined as hereinbefore described, the embodiment differing only in the method of achieving the resonant frequency ratio.

Figure 10:
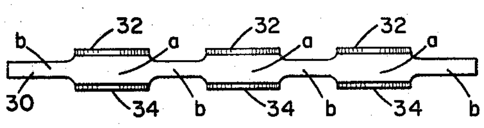
FIGURE 10 is a front view illustrating a multi-resonator structure similar to the single resonator structure of FIGURE 9.

In FIGURE 10 of the drawings there is shown a multi-resonator structure formed with regions of different thicknesses similar to the single resonator embodiment of FIGURE 9. Specifically, there is shown a wafer 30 having a plurality of regions $a$ of thickness $t_a$ surrounded by material of thickness $t_b$. A plurality of electrodes 32 and 34 are attached to regions $a$ as shown. Similar to the embodiment of FIGURE 8 each electrode pair 32 and 34 forms a piezoelectric resonator with the intervening piezoelectric material and having a predetermined range of action. With respect to each individual resonator the range of action is small as a result of the vibrating mode of each resonator being confined to the electroded region $a$ and attenuated exponentially in the surrounding region $b$.

Figure 11:
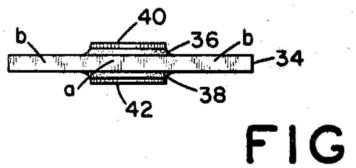
FIGURE 11 is a front view illustrating still another embodiment of the resonator illustrated in FIGURES 4 and 5.

Referring to FIGURE 11 there is shown another embodiment of the resonator and method of achieving regions of different resonant frequency. This embodiment comprises a quartz wafer 34 of uniform thickness $t_b$. A circular inner region $a$ of increased thickness is formed by depositing, such as by evaporation, suitable material layers 36 and 38. In the case of quartz for example evaporated layers of silicon monoxide or layers of fired on glass may be used. Electrodes 40 and 42 are subsequently applied to the surface of layers 36 and 38 to provide the completed resonator structure shown in FIGURE 11. Alternately, the electrodes 40 and 42 may be first applied to region *a* and the layers 36 and 38 deposited on the surfaces of the electrodes.

The equation for frequency ratio $\Omega_0$ for the embodiments described in connection with FIGURE 11 will be similar to Equation 13 differing only in the additional term of $\rho_1$ (density of material layers 36 and 38).

Still another embodiment of the invention may be described in reference to FIGURES 4 and 5 of the drawings. More specifically, with respect to the wafer 12, region *a* between the electrodes may be formed from piezoelectric material such as quartz while region *b* may be formed from a second non-piezoelectric material such as aluminum or fused quartz to provide an electroded region of piezoelectric material surrounded by a region of non-piezoelectric material. This structure may be achieved such as for example by fabricating wafer 12 from the non-piezoelectric material and providing an aperture in which can be mounted such as with a suitable adhesive, an insert of the piezoelectric material. The insert comprising region *a* may be of the same thickness similar to the structure shown in FIGURES 4 and 5 or be of a different thickness similar to the structure shown in FIGURE 9 depending on the compositional relationship and the desired frequency relationship. The following equations may be derived for $f_a$, $f_b$ and $\Omega_0$ from which suitable dimensional and compositional relationships may be determined.

$$f_b=\frac{N_b}{t_b} \quad (14)$$

$$f_a=\frac{N_a}{t_a} \quad (15)$$

$$f_a=\frac{N_a}{t_a}\left[1-2\frac{\rho_e}{\rho_q}t_e\right] \quad (16)$$

$$\Omega_0=\frac{f_a}{f_b}=\frac{N_a}{N_b}\frac{t_b}{t_a}\left[1-2\frac{\rho_e}{\rho_q}t_e\right] \quad (17)$$

where $N_a$ and $N_b$ are the appropriate frequency constants for regions *a* and *b* corresponding to the compositions thereof. Similar to the embodiments previously described the region *b* of non-piezoelectric material will result in exponential attenuation of a vibrating mode in the inner piezoelectric region *a*.

While the embodiments of the invention have been disclosed in connection with piezoelectric wafers having generally planar parallel surfaces for purposes of simplicity it is to be understood that invention is equally applicable to wafers having non-parallel surfaces or of tapering thickness. For example, in the case of the embodiments shown in FIGURES 4, 5 and 8 the wafer 12 may be of uniform thickness in the center portion thereof and may be gradually decreased in thickness according to a mathematical function with distance from the electrode edge to result in a gradually increasing resonant frequency with distance from the electrode edge. In the case of the embodiment shown in FIGURES 9, 10 and 11 the regions *a* and *b* need not have sharply defined edges as shown but rather may be connected by a gradually decreasing thickness portion.

While several embodiments of the invention have been disclosed it will be apparent that many additional structural and compositional variations are possible without departing from the scope of the invention as defined in the appended claims.

It is claimed and desired to be secured by Letters Patent of the United States:

1. A piezoelectric resonator comprising: a thin wafer; a first region in said wafer at least partially formed from piezoelectric material and responsive piezoelectrically to an applied electrical signal to vibrate in a thickness mode of vibration; a second region in said wafer surrounding said first region; said first region being at least partially different in composition from said second region to have a lower resonant frequency than said second region whereby a vibratory mode originating in said first region is attenuated exponentially in said second region; and electrode means associated with said first region for applying an electrical signal thereto.

2. A piezoelectric resonator comprising: a thin wafer of piezoelectric material having a thickness mode of vibration and a predetermined resonant frequency; a layer of material deposited on at least one side of said wafer in spaced relationship with the edges of said wafer to define a region in said wafer partially different in composition from the surrounding wafer material; and electrodes formed on said layer and the opposite side of said wafer for applying an electrical signal to said region; said region having a resonant frequency lower than said predetermined resonant frequency whereby a vibratory mode in said region is attenuated exponentially in the surrounding wafer material.

3. A piezoelectric resonator as claimed in claim 2 wherein said deposited material comprises an evaporated layer of insulating material.

4. A piezoelectric resonator as claimed in claim 2 wherein said deposited material is insulating material selected from the group consisting of silicon monoxide and glass.

5. A piezoelectric resonator comprising: a thin wafer of piezoelectric material having a thickness mode of vibrations; a first electroded region in said wafer having a first resonant frequency $f_a$; and a second region in said wafer surrounding said first region and having a second higher resonant frequency $f_b$ to provide a cut-off frequency for a vibratory mode in said first region; said first and second regions comprising separate parts bonded together and having different densities whereby the ratio $f_a/f_b$ is in the range of 0.8 to .999.

6. A piezoelectric resonator comprising: a thin wafer of piezoelectric ceramic material having a thickness mode of vibration; a first electroded region in said wafer having a first resonant frequency $f_a$; and a second region in said wafer surrounding said first region and having a second higher resonant frequency $f_b$ to provide a cut-off frequency for a vibratory mode in said first region; said first region having material diffused in the surface thereof to establish a different density and composition of said first region relative to said second region and to establish a ratio $f_a/f_b$ in the range of 0.8 to .999.

7. A multi-resonator structure comprising: a thin wafer; a plurality of spaced planar regions in said wafer at least partially different in composition from the surrounding wafer portions whereby each of said regions has a resonant frequency lower than that of the surrounding wafer portion so that a vibratory mode in each of said regions is attenuated exponentially in the surrounding wafer portion; each of said regions being responsive piezoelectrically to an applied electrical signal to vibrate in a thickness mode; and electrode means associated with each of said regions for applying an electrical signal thereto.

8. A piezoelectric resonator comprising: a thin unitary wafer structure having a first region formed from a first piezoelectric material having a thickness mode of vibration defining a first resonant frequency and having a second region formed from a second different material surrounding said first region defining a second resonant frequency; said second region having a central plane coincident with the central plane of said first region; said second resonant frequency comprising a cut-off frequency for a vibrating mode in said first region.

9. A piezoelectric resonator as claimed in claim 8 wherein said second region is formed from non-piezoelectric material.

10. A piezoelectric resonator comprising: a thin wafer defining a first electroded region responsive piezoelectrically to an applied signal to produce a thickness mode of vibration having a first resonant frequency; said wafer defining a second non-piezoelectric region surrounding said first region and having a second resonant frequency defining a cut-off frequency for a vibratory mode in said first region.

11. In piezoelectric resonator, the combination comprising: a thin wafer; a first electroded region in said wafer having a predetermined thickness and a first resonant frequency $f_a$ related to said thickness; said first region being responsive piezoelectrically to an applied signal to vibrate in a thickness shear mode; and a non-piezoelectric region in said wafer surrounding said first region; said second region having a predetermined lesser thickness than said first region to define a second higher resonant frequency $f_b$; said second resonant frequency comprising a cut-off frequency for a vibratory mode in said first region.

12. A piezoelectric resonator as claimed in claim 11 wherein said first and second resonant frequencies are related such that $f_a/f_b$ is in the range of .8 to .999.

13. A piezoelectric resonator comprising: a thin wafer; a first electroded region in said wafer having a first resonant frequency $f_a$; said first region being at least partially formed from a piezoelectric material to be responsive piezoelectrically to an applied signal to vibrate in a thickness mode of vibration; and a second region of non-piezoelectric material in said wafer surrounding said first region; said second region having a second higher resonant frequency $f_b$ defining a cut-off frequency for a vibratory mode in said first region.

14. A piezoelectric resonator as claimed in claim 13 wherein said first wafer region has a thickness shear mode of vibration and said first and second resonant frequencies are related such that $f_a/f_b$ is in the range of .8 to .999.

15. A piezoelectric resonator comprising: a thin wafer having a first region defining a recess in at least one face surface thereof and a second region surrounding said first region; a piezoelectric material in said recess having a thickness mode of vibration; and electrode means on said wafer for applying an electrical signal to said piezoelectric material; said second region having a resonant frequency exceeding the resonant frequency of said first region to attenuate exponentially the vibratory mode in said first region.

References Cited

UNITED STATES PATENTS

| | | | |
|---|---|---|---|
| 3,222,622 | 12/1965 | Curran | 310—8.1 |
| 2,969,512 | 1/1961 | Jaffe | 310—9.7 |
| 2,943,279 | 6/1960 | Mattiat | 310—9.6 |
| 2,900,536 | 8/1959 | Palo | 310—9.6 |
| 2,695,357 | 11/1954 | Donley | 310—9.7 |

OTHER REFERENCES

W. S. Mortley, Frequency Modulated Quartz, oscillators, Proc. I.E.E., 104B, 15 (1957).

MILTON O. HIRSHFIELD, *Primary Examiner.*

J. D. MILLER, *Assistant Examiner.*

UNITED STATES PATENT OFFICE

CERTIFICATE OF CORRECTION

Patent No. 3,384,768 May 21, 1968

William Shockley et al.

It is certified that error appears in the above identified patent and that said Letters Patent are hereby corrected as shown below:

Column 4, line 17, the "X" was omitted in two instances, i.e., before both the 1 and the 3 regarding the dimensional variable; line 68, "those" should read -- these --. Column 6, line 25, (Example 7), the density of quartz is indicated as "$\rho_p$" and should be -- $\rho_q$ --. Column 9, line 8, the density of material layers 36 and 38 read "$\rho_1$" should read --$\rho_\ell$ --.

Signed and sealed this 20th day of October 1970.

(SEAL)

Attest:

Edward M. Fletcher, Jr.
Attesting Officer

WILLIAM E. SCHUYLER, JR.
Commissioner of Patents